United States Patent [19]

Rice et al.

[11] Patent Number: 5,722,668
[45] Date of Patent: Mar. 3, 1998

[54] PROTECTIVE COLLAR FOR VACUUM SEAL IN A PLASMA ETCH REACTOR

[75] Inventors: Michael Rice, Pleasanton; Eric Askarinam, Sunnyvale, both of Calif.

[73] Assignee: Applied Materials, Inc.

[21] Appl. No.: 235,602

[22] Filed: Apr. 29, 1994

[51] Int. Cl.$^6$ ............................................. F16J 15/10
[52] U.S. Cl. ..................... 277/180; 277/181; 118/723 E
[58] Field of Search ............................ 277/181, 182, 277/180; 156/345 P; 118/723 E

[56] References Cited

U.S. PATENT DOCUMENTS

| | | | |
|---|---|---|---|
| 3,512,789 | 5/1970 | Tanner | 277/180 |
| 4,095,809 | 6/1978 | Smith | 277/180 |
| 5,240,556 | 8/1993 | Ishikawa et al. | 156/345 P |
| 5,518,257 | 5/1996 | Breaker | 277/180 |

FOREIGN PATENT DOCUMENTS

| | | |
|---|---|---|
| 168162 | 1/1986 | European Pat. Off. . |
| 0520519 | 6/1992 | European Pat. Off. . |
| 0552490 | 12/1992 | European Pat. Off. . |
| 0552491 | 12/1992 | European Pat. Off. . |
| 552491 | 7/1993 | European Pat. Off. . |
| 0601468 | 12/1993 | European Pat. Off. . |
| 3173784 | 7/1991 | Japan . |

*Primary Examiner*—Scott Cummings
*Attorney, Agent, or Firm*—Barnes, Kisselle, Raisch, Choate, Whittemore & Hulbert, P.C.

[57] ABSTRACT

A vacuum seal assembly that can be used in a plasma etch reactor to seal the chamber interior from the outside environment consists of a protective collar that is injection molded or machined of a high strength, high temperature and corrosion resistant thermoplastic material, the collar has an elastomeric gasket installed therein and is used in combination with a second elastomeric gasket to achieve a fluid-tight seal between two rigid surfaces made of silicon and quartz, respectively.

4 Claims, 3 Drawing Sheets

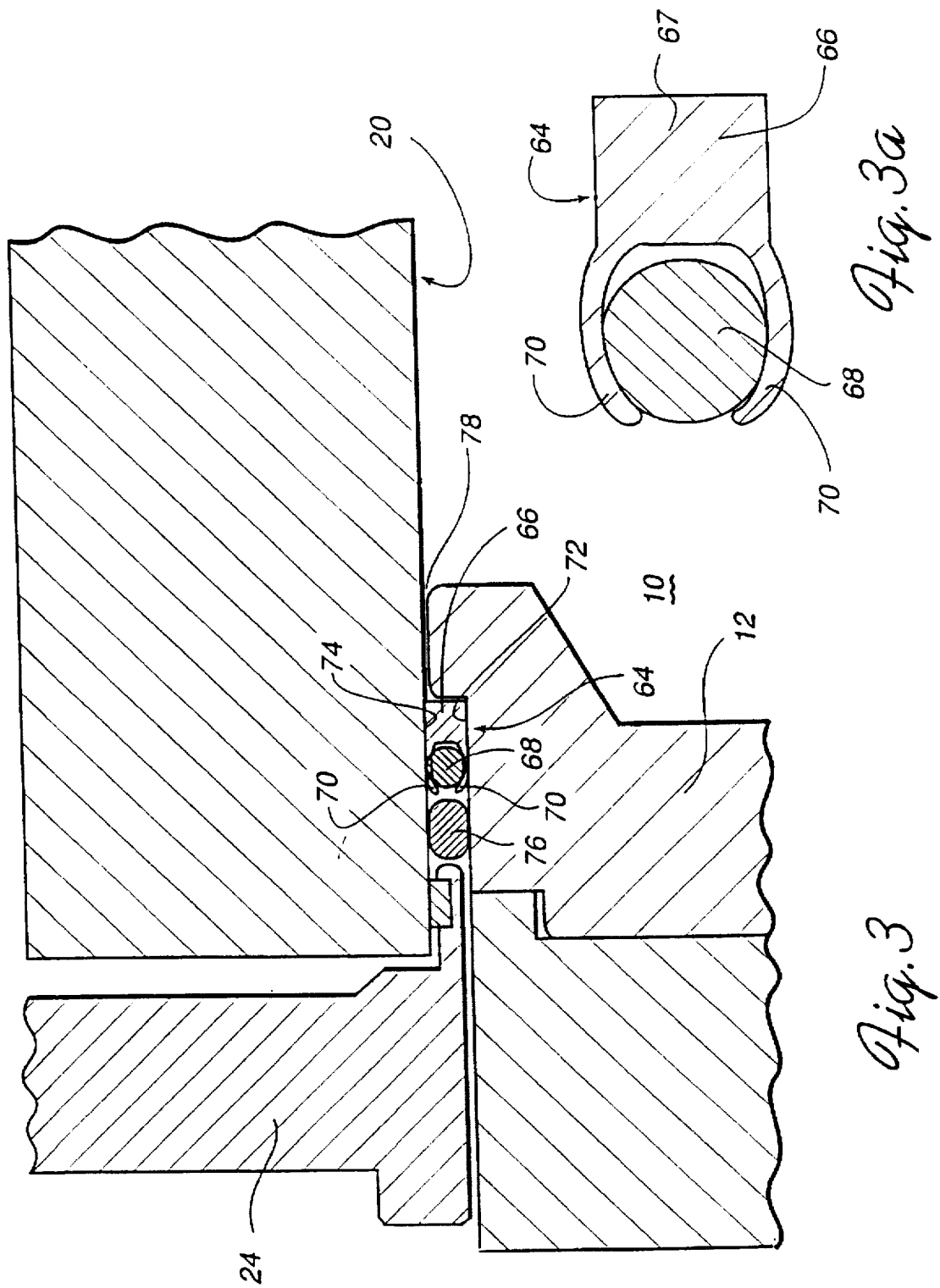

PROTECTIVE COLLAR FOR VACUUM SEAL IN A PLASMA ETCH REACTOR

FIELD OF THE INVENTION

The present invention generally relates to a protective collar used in a vacuum seal assembly and more particularly relates to a protective collar used in a vacuum seal assembly that is machined or injection molded of a high strength, high temperature thermoplastic material that contain low levels of metal contamination.

BACKGROUND OF THE INVENTION

Plasma etch reactors have been used for processing oxide films on semiconductor substrates for many years. In a typical plasma etch reactor, a reactant gas such as a carbon-fluorine gas of $C_2F_6$ is sufficiently excited by an RF field and confined by magnetic fields to generate a plasma inside the reaction chamber. The plasma contains ions and free radicals of species such as F and $CF_3$. The F radicals etch any silicon dioxide film existing on the substrate, while carbon and fluorine atoms or ions in the plasma combine to form a fluorocarbon polymer.

European patent publication No. 0,520,519 A1 discloses a novel inductively coupled plasma etch reactor for etching thin films formed on a silicon wafer using an RF plasma etch process, the disclosure of which is incorporated herein in its entirety by reference. Such a reactor can be used to selectively etch silicon dioxide films over non-oxide films such as polysilicon or silicon nitride on the wafer.

U.S. patent application Ser. No. 07/941,501 filed Sep. 8, 1992 by Marks, et al. entitled "Selectivity For Etching An Oxide Over A Nitride" discloses how to use an inductively coupled plasma reactor of the type disclosed in the above-referenced European patent publication to form a fluorocarbon polymer film that has less than 40% fluorine over a non-oxide film. This improvement is realized by increasing the proportion of carbon in the plasma relative to fluorine, and is accomplished by introducing a fluorine scavenger into the plasma. One such recommended scavenger is silane gas.

U.S. patent application Ser. No. 07/984,045 filed Dec. 1, 1992 by Collins, et al. and U.S. patent application Ser. No. 07/941,507 filed Sep. 8, 1992 by Collins, et al. disclose, respectively, a capacitively and an inductively coupled plasma etch apparatus in which a fluorine scavenger material in the form of a silicon ceiling inside the reactor chamber is introduced to achieve the same type of advantages as realized in the above-referenced Marks, et al. application. The silicon ceiling emits silicon atoms into the plasma which scavenge fluorine ions out of the plasma, providing the desired carbon-to-fluorine ratio in the plasma to form a carbon-rich polymer impervious to fluorine in the plasma over the non-oxide film such as silicon nitride and polysilicon.

A problem frequently encountered with plasma etch reactors, particularly the inductively coupled plasma reactor of the type disclosed in the above-referenced European patent publication, is that the chamber sidewall is preferably formed of quartz (silicon dioxide) which seals the chamber interior from the outside environment by sealingly engaging a silicon ceiling and an aluminum cylindrical top wall. Based on the fact that silicon, quartz and aluminum are all rigid materials, it is difficult to achieve a gas impervious seal between surfaces made of these materials.

Numerous sealing methods have been tried in plasma etch reactors to achieve a satisfactory chamber seal. One of such sealing methods involves the cutting of grooves in the bottom rim of the aluminum top wall and the installation of gaskets made of either an elastomer or Teflon in the grooves. This sealing method turned out to be unsatisfactory for two reasons. First, since the aluminum cylindrical top wall is normally cooled and kept at a relatively low temperature, e.g. 60°–100° C., fluorine and carbon ions in the reactor chamber escape through the gap between the silicon ceiling and the quartz sidewall and form a fluorocarbon polymer on the exposed bottom rim of the aluminum top wall. The fluorocarbon polymer becomes a source of particulates for the chamber and the semiconductor substrate in subsequent etching processes. Secondly, the elastomeric gaskets (typically O-rings) installed in the grooves in the bottom rim of the aluminum top wall are frequently attacked by corrosive fluorine ions or radicals and deteriorates and looses their sealing function. Additionally, the elastomeric gaskets contain relatively high levels of metal impurities which become particles in the chamber upon exposure.

Another sealing method that has been tried in the sealing of a plasma etch reactor chamber is the installation of an elastomeric gasket in between the contact surfaces of the silicon ceiling and the quartz sidewall. This design eliminates the process of deposition on the aluminum surface. This again turned out to be ineffective due to the presence of corrosive fluorine gas escaping from the reactor chamber through the gap between the silicon ceiling and the quartz sidewall that corrodes the gasket. The corrosion occurs even when the gaskets are molded or machined of chemical resistant fluorocarbon elastomers. Also, these materials can fail due to exposure of UV light created in the chamber.

It is therefore an object of the present invention to provide a sealing assembly for use in between contact surfaces of a silicon ceiling and a quartz sidewall in a plasma etch reactor chamber that does not have the shortcomings of the prior art sealing methods.

It is another object of the present invention to provide a sealing assembly for use in sealing a plasma etch reactor chamber that can be installed and replaced economically such that it can be suitably used in a manufacturing process.

SUMMARY OF THE INVENTION

In accordance with the present invention, a sealing assembly for use between contact surfaces in a plasma reactor to provide a fluid-tight seal of the chamber interior from the outside environment is provided, for example, between a silicon ceiling and a quartz sidewall in an etch reactor.

In the preferred embodiment, the sealing assembly includes an elastomeric gasket and a sacrificial protective collar. The material of the protective collar can be a high temperature thermoplastic resistant to etching and need not be highly elastic.

In the preferred embodiment, the protective collar has, in its cross-sectional area, an open end and a closed end. The open end is formed by two fingers opposing each other and in compressive frictional engagement with an elastomeric gasket installed therein such that the fingers are forced to spread outwardly against the contact surfaces to provide a fluid-tight seal. The thermoplastic material used in the injection molding of the protective collar should not contain metal fillers which may act as contaminants in the reactor chamber.

Suitable materials used for the elastomeric gasket are fluorocarbon elastomers or any other elastomer that has similar properties. Desirable thermoplastic materials used in injection molding the protective collar are polyetheretherketone, polyimide, polyphenylene sulfide and polytetrafluoroethylene. Other high strength, high temperature and corrosion resistant thermoplastics that are injection moldable or machinable can also be used in making the protective collar.

The present invention is further directed to a sacrificial protective collar, and to a plasma etch reactor that employs a sealing assembly of an elastomeric gasket and a thermoplastic sacrificial protective collar.

BRIEF DESCRIPTION OF THE FIGURES

Other objects, features and advantages of the present invention will become apparent upon consideration of the specification and the appended drawings, in which:

FIG. 3 is an enlarged, partial, cross-sectional view of the present invention sealing assembly used between a silicon ceiling and a quartz sidewall in a plasma etch reactor.

FIG. 3a is an enlarged, cross-sectional view of a protective collar.

DETAILED DESCRIPTION OF THE PREFERRED EMBODIMENT

One embodiment of the present invention is a novel sealing assembly used between surfaces of a silicon ceiling and a quartz sidewall of a plasma etch reactor. The sealing assembly not only provides satisfactory sealing function between two rigid contact surfaces, but also provides protection against any deteriorating effect on the elastomeric gasket by the corrosive gases produced in the reactor chamber.

Figure 1:
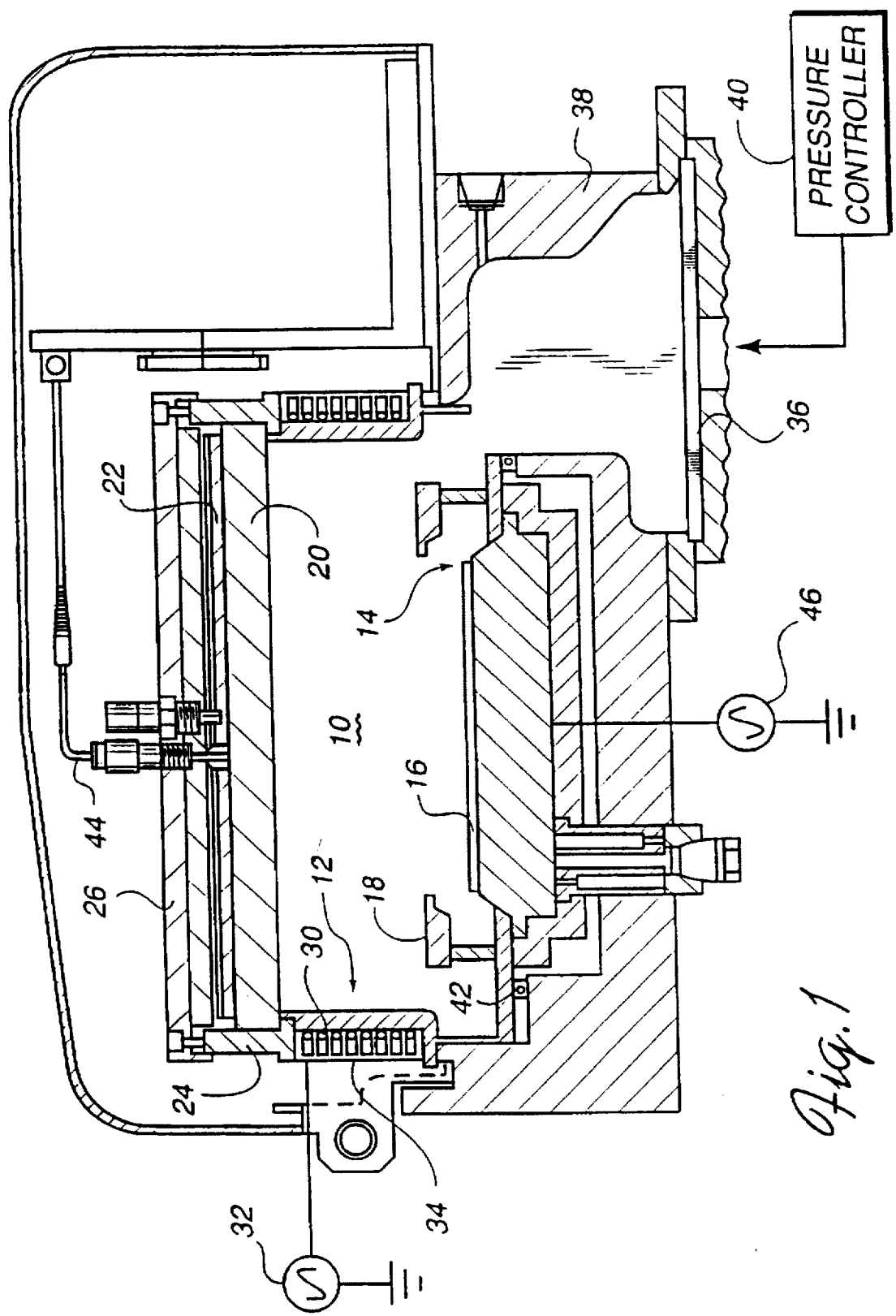
FIG. 1 is a cross-sectional view of a typical plasma etch reactor utilized in the present invention.

Referring initially to FIG. 1, a cross-sectional view is shown of a typical plasma etch reactor equipped with a silicon ceiling as a scavenging surface. The silicon ceiling is a source of silicon atoms which scavenge fluorine out of the plasma to thereby provide a desired carbon-to-fluorine ratio forming a carbon-rich polymer impervious to the fluorine in the plasma over the non-oxide (e.g. polysilicon or silicon nitride) film. In a typical etching process, a reactant gas such as $C_2F_6$ is excited sufficiently to generate a plasma inside the reactor chamber and to produce ions and free radicals of F and $CF_3$. The F radicals etch any silicon dioxide film on the wafer, while carbon and fluorine atoms or ions in the plasma combine on the wafer surface to form a polymer.

The polymer disassociates when formed on silicon dioxide surfaces due to the effect of oxygen freed from the silicon dioxide film during the etch process, and due to the effect of fluorine in the plasma. However, when polymer is formed on non-oxide film (e.g. polysilicon or silicon nitride), the polymer accumulates due to the lack of oxygen in the underlying non-oxide film. This formation inhibits etching of the underlying non-oxide film and thereby, provides a pronounced etch selectivity of the oxide film over the non-oxide film. The selectivity is of great importance when etching vias through a silicon dioxide layer overlying a non-oxide layer which is not to be etched. The selectively is limited if the polymer formed over the polysilicon layer contains more than 40% fluorine by weight, because such polymers are susceptible to being attacked by fluorine in the plasma, and therefore provide only limited protection to the underlying polysilicon layer.

Figure 2:
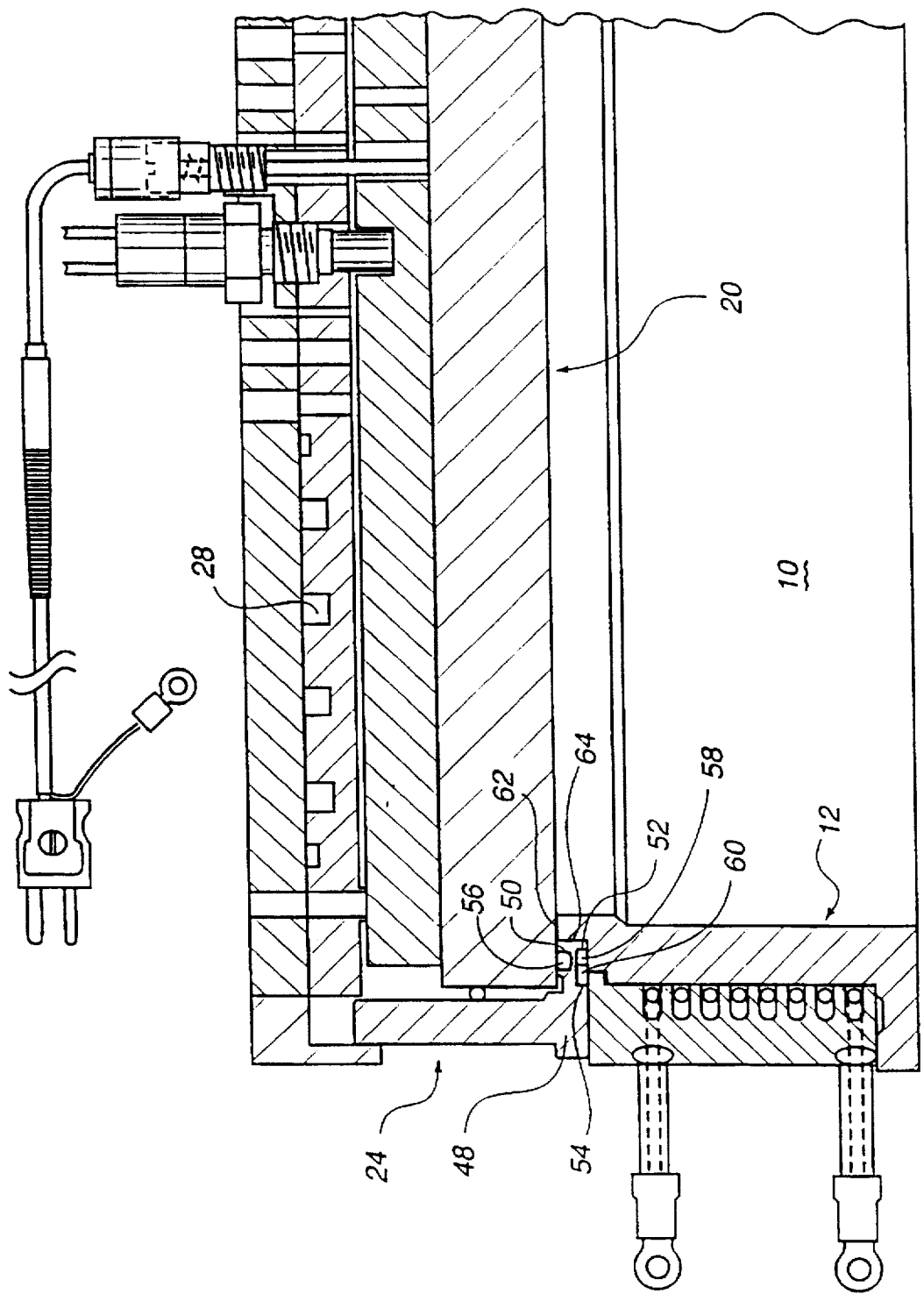
FIG. 2 is an enlarged, partial, cross-sectional view of a prior art sealing assembly used between a silicon ceiling and a quartz sidewall in a plasma etch reactor.

FIG. 1 shows an inductively coupled plasma etch reactor of the general type described in the above-referenced European patent publication. The reactor includes a vacuum chamber 10 enclosed by a cylindrical quartz sidewall 12 and a bottom 14 including a cathode assembly on which a silicon wafer 16 is held by a retractable annular holder 18 on a pedestal 19. The ceiling 20 is made of crystalline silicon and heated by an overlying heating element 22 connected to a temperature controller (not shown). A cylindrical aluminum top wall 24 rests on the quartz sidewall 12 and supports an overlying cooling element 26 in which coolant is circulated through water jacket 28 as shown in FIG. 2. This arrangement cools the quartz sidewall 12 through the aluminum cylindrical top wall 24.

A helical cylindrical antenna coil 30 is wrapped around the cylindrical quartz sidewall 12 and is connected to an RF energy source 32 to inductively couple energy to the plasma in the chamber 10. A ceramic cylindrical cover 34 made of materials such as $Al_2O_3$ or $Si_3N_4$ surrounds the antenna coil 30.

A gate valve-vacuum pump assembly 36 draws gas from the chamber 10 through an opening in the chamber body 38 to maintain a vacuum in the chamber 10 determined by a pressure control device 40. A gas feed 42 feeds reactant gases such as $C_2F_6$ into the chamber 10.

In order to maintain the temperature of the interior surface of the quartz sidewall 12 well above 170° C., a heating element (not shown) rests in the interior of the ceramic cover 34 near the bottom of the quartz sidewall 12 and is connected to an electrical source (not shown). The apparatus for heating the sidewall and the ceiling are disclosed by Rice, et al. in U.S. patent application 08/138,060, filed Oct. 15, 1993.

The temperature of the silicon ceiling 20 determines the rate at which silicon atoms scavenge the plasma within the chamber 10, and therefore affects the carbon-to-flourine content ratio. Accordingly, the silicon ceiling 20 is maintained at a temperature corresponding to a carbon-flourine plasma ratio providing a polymer carbon content greater than 60% by weight. Such temperature control of the ceiling 20 is provided by a controller governing the ceiling heat source in accordance with a signal received from a thermocouple 44 attached to the silicon ceiling 20. Heat conduction to the silicon ceiling 20 is set by a suitable air gap between the heater 22 and the ceiling 20.

During an etching process, the source RF power of the RF source 32 is in the range of 2,000–3,000 watts at about 2 MHz. The bias RF power of an RF source 46 connected to the pedestal 19 is in the range of 500–1500 watts at 1.8 MHz, depending on the size of the wafer 16. The silicon ceiling temperature is in the range of 200°–300° C., and is normally set at approximately 260° C. The quartz sidewall interior surface temperature is in the range of between 170° C. and 230° C., and is normally set at 220° C. The $C_2F_6$ gas flow rate is between 20–50 standard cubic centimeters per minute and the chamber pressure is between 1–10 millitorr.

In a typical etching process for oxide films, a high density, low pressure plasma is used. The chemistry involved is the dissociation of $C_2F_6$ into components of $CF_2$, F and C. The $CF_2$ is the active etching component of the gas, while F and C forms a fluorocarbon polymer that deposits on any surface that is relatively cool, i.e. at a temperature of 100° C. or below.

In a prior art sealing assembly, as shown in FIG. 2, a bottom rim 48 of the aluminum top wall 24 acts as a seal for the chamber 10. The bottom rim 48 is equipped with grooves 50, 52 and 54. In grooves 50, 52 and 54, fluorocarbon elastomeric gaskets 56, 58, and a teflon gasket 60 are installed. However, fluorocarbon polymer escapes through a gap 62 between the silicon ceiling 20 and the quartz sidewall 12 and deposits on an inner circumferential surface 64 of the bottom rim 48 of the aluminum top wall 24 since the wall 24 is normally maintained at a temperature of 80° C. The polymer does not deposit on other chamber surfaces, i.e. that of the silicon ceiling and of the quartz sidewall, due to the fact that these surfaces are maintained at much higher temperatures of approximately 260° C. and 220° C., respectively. The deposition of the fluorocarbon polymer on the aluminum top wall 24 causes contamination in the reactor chamber 10 in subsequent etching processes. Moreover, corrosive fluorine gas escapes through the gap 62 and corrodes the fluorocarbon gaskets 56 and 58 during the etching process and causes further contamination of the chamber 10.

The solution to these sealing problems is the use of a novel protective collar, or a sacrificial protective shield, made of a high strength, high temperature and corrosion resistant thermoplastic material which contains low levels of metal fillers. Since the collar does not act as a vacuum seal, its elastic properties are not critically important. The protective collar serves a sacrificial function in that it may be corroded by the active fluorine gas after extended exposure. However, it effectively shields the elastomeric gasket from corrosion. The protective collar is made by an inexpensive injection molding process and therefore can be inexpensively replaced. A typical protective collar may be used for a minimum of 5,000 etch cycles.

A seal assembly that includes an annular protective collar 64 is shown in FIG. 3. The protective collar 64 consists of an injection molded or machined thermoplastic body 66 and an elastomeric gasket 68. The protective collar 64 has in its vertical cross-section at the open end equipped with two annular fingers 70 and a closed end 67. This is shown in FIG. 3a. The fingers 70 are situated opposing to each other and are generally circularly shaped to accept the elastomeric gasket 68 there in between. FIG. 2 shows that the fingers 70 are forced by the gasket 68 to spread outwardly against two sealing surfaces 72 and 74 of the quartz wall 12 and silicon ceiling 20 such that a seal is achieved between the chamber 10 and the outside environment and that gas exchange is significantly reduced. It is to be noted that the gaskets 68, 76 are shown in a compressed state.

The seal assembly further includes an elastomeric gasket 76 which is installed between the protective collar 64 and the aluminum cylindrical top wall 24. During assembly of the etch chamber, the gasket and the collar are held in place in a groove of the quartz sidewall formed by the sidewall and the aluminum cylindrical top wall. It is to be noted that the open end of the protective collar 64 is molded to face away from the chamber 10 so as to protect the elastomeric gaskets 68 and 76. The protective collar 64 shields any corrosive gas escaping from the chamber 10 through a gap 78 between the top of the sidewall 12 and the ceiling 20 from reaching the elastomeric gaskets 68 and 76. The novel seal assembly therefore provides a vacuum seal that withstands highly corrosive fluorine gas to prevent any deterioration of the elastomeric gaskets and the generation of contaminating particles inside the etch chamber.

The protective collar 64 can be injection molded of any high strength, high temperature and corrosion resistant thermoplastic materials. Some of the suitable materials are polyetheretherketone, polyimide, polyphenylene sulfide and polytetrafluoroethylene, etc. and the blends of these materials. These thermoplastic materials should not contain any metal fillers which may become possible contaminants in the reactor chamber. A typical collar molded of polyetheretherketone is commercially available from Greene Tweed Incorporated. The elastomeric gasket 68 and 76 may be molded of any high strength, high temperature and corrosion resistant elastomeric materials such as fluorocarbon elastomers, fluorosilicon elastomers, etc. However, their corrosion resistance can be less than if they were not protected by the collar.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention. For instance, protective collars that have other configurations different than the one shown may also be suitably used as long as a fluid-tight seal can be achieved between the sealing surfaces of the silicon ceiling and the quartz sidewall. It is also to be appreciated that the present invention seal assembly may be used in any sealing arrangement other than a plasma etch chamber that requires a fluid-tight seal between any two surfaces.

The embodiments of the invention in which an exclusive property or privilege is claimed are defined as follows:

1. A vacuum chamber comprising:

a rigid ceiling member defining the upper boundary of the interior of said chamber, said rigid ceiling member having a first surface facing downwardly, a rigid sidewall member having a second surface that faces upwardly for sealingly engaging said first surface of said rigid ceiling member, a first elastomeric seal member compressively engaged between said first and said second surface, and a protective collar positioned between said first elastomeric seal member and said chamber interior, said collar being compressively engaged between said first and said second surfaces.

2. A vacuum chamber according to claim 1, wherein said protective collar-having in its cross-sectional area an open end facing said first elastomeric seal member, said open end being formed by two fingers opposing each other and in frictional engagement with first elastomeric seal member situated therein such that said open end facing away from said chamber.

3. A vacuum chamber according to claim 1, wherein said vacuum chamber is a plasma etch chamber.

4. A vacuum chamber according to claim 1, wherein said rigid ceiling member is made of silicon and said rigid sidewall is made of quartz.

* * * * *